United States Patent
Callegari et al.

(10) Patent No.: US 7,223,670 B2
(45) Date of Patent: May 29, 2007

(54) DUV LASER ANNEALING AND STABILIZATION OF SICOH FILMS

(75) Inventors: Alessandro C. Callegari, Yorktown Heights, NY (US); Stephan A. Cohen, Wappingers Falls, NY (US); Fuad E. Doany, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 10/923,247

(22) Filed: Aug. 20, 2004

(65) Prior Publication Data

US 2006/0040513 A1 Feb. 23, 2006

(51) Int. Cl.
*H01L 21/76* (2006.01)

(52) U.S. Cl. ............. 438/400; 438/795; 257/E21.328

(58) Field of Classification Search ............ 438/795, 438/796, 797, 798, 400; 257/E21.331, E21.328
See application file for complete search history.

(56) References Cited

U.S. PATENT DOCUMENTS

| | | | |
|---|---|---|---|
| 4,933,206 A * | 6/1990 | Cox | 427/558 |
| 6,147,009 A | 11/2000 | Grill et al. | |
| 6,312,793 B1 | 11/2001 | Grill et al. | |
| 6,437,443 B1 | 8/2002 | Grill et al. | |
| 6,441,491 B1 | 8/2002 | Grill et al. | |
| 6,479,110 B2 | 11/2002 | Grill et al. | |
| 6,497,963 B1 | 12/2002 | Grill et al. | |
| 6,541,398 B2 | 4/2003 | Grill et al. | |
| 7,030,468 B2 * | 4/2006 | Gates et al. | 257/632 |
| 2002/0050489 A1 * | 5/2002 | Ikegami et al. | 219/121.69 |
| 2003/0087043 A1 * | 5/2003 | Edelstein et al. | 427/569 |
| 2003/0234450 A1 * | 12/2003 | Grill et al. | 257/759 |
| 2004/0014273 A1 | 1/2004 | Bhattacharyya et al. | |
| 2004/0063308 A1 * | 4/2004 | Bao et al. | 438/637 |
| 2004/0063310 A1 | 4/2004 | Ngo et al. | |
| 2004/0115876 A1 | 6/2004 | Goundar et al. | |
| 2005/0156285 A1 * | 7/2005 | Gates et al. | 257/632 |
| 2006/0055004 A1 * | 3/2006 | Gates et al. | 257/632 |
| 2006/0079099 A1 * | 4/2006 | Nguyen et al. | 438/789 |
| 2006/0091559 A1 * | 5/2006 | Nguyen et al. | 257/775 |
| 2006/0154086 A1 * | 7/2006 | Fuller et al. | 428/428 |

OTHER PUBLICATIONS

Callegarl, et al., "DUV stability of carbon films for attenuated phase shift mask application", SPIE 23rd Annual International Symposium on Microlithography, Santa Clara, CA, Feb. 22-27, 1998.

* cited by examiner

*Primary Examiner*—Michael Trinh
*Assistant Examiner*—Seth Barnes
(74) *Attorney, Agent, or Firm*—Scully, Scott, Murphy & Presser, P.C.; Robert M. Trepp, Esq.

(57) ABSTRACT

A method of fabricating a dielectric film comprising atoms of Si, C, O and H (hereinafter SiCOH) that has improved insulating properties as compared with prior art dielectric films, including prior art SiCOH dielectric films that are not subjected to the inventive deep ultra-violet (DUV) is disclosed. The improved properties include reduced current leakage which is achieved without adversely affecting (increasing) the dielectric constant of the SiCOH dielectric film. In accordance with the present invention, a SiCOH dielectric film exhibiting reduced current leakage and improved reliability is obtained by subjecting an as deposited SiCOH dielectric film to a DUV laser anneal. The DUV laser anneal step of the present invention likely removes the weakly bonded C from the film, thus improving leakage current.

20 Claims, 5 Drawing Sheets

DUV LASER ANNEALING AND STABILIZATION OF SICOH FILMS

FIELD OF THE INVENTION

The present invention relates to a method of fabricating a dielectric film for use in semiconductor applications such as BEOL (back-end-of-the-line) applications, and more particularly to a method of fabricating a dielectric film comprising Si, C, O and H atoms (herein after "SiCOH"), also called C doped oxide (CDO), that has a low dielectric constant (k), improved leakage current and improved film reliability. The present invention also relates to the dielectric film that is fabricated using the method of the present invention as well as electronic structures, such as interconnect structures, that include the inventive dielectric film.

BACKGROUND OF THE INVENTION

The continuous shrinking in dimensions of electronic devices utilized in ULSI (ultra large scale integration) circuits in recent years has resulted in increasing the resistance of the BEOL metallization as well as increasing the capacitance of the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are needed to reduce the capacitances. Dielectric materials (i.e., dielectrics) that have low k values are commercially available. One such commercially available material, for example, is polytetrafluoroethylene ("PTFE"), which has a dielectric constant of about 2.0. Most commercially available dielectric materials however are not thermally stable when exposed to temperatures above 300° C. Integration of low k dielectrics in present ULSI chips requires a thermal stability of at least 400° C.

The low k materials that have been considered for applications in ULSI devices include polymers containing atoms of Si, C, O and H, such as methylsiloxane, methylsilsesquioxanes, and other organic and inorganic polymers. For instance, a paper (N. Hacker et al. "Properties of new low dielectric constant spin-on silicon oxide based dielectrics" *Mat. Res. Soc. Symp. Proc.* 476 (1997): 25) describes materials that appear to satisfy the thermal stability requirement, even though some of these materials propagate cracks easily when reaching thicknesses needed for integration in an interconnect structure when films are prepared by a spin-on technique. Furthermore, these prior art precursor materials are high cost and prohibitive for use in mass production. Moreover, most of the fabrication steps of very-large-scale-integration ("VLSI") and ULSI chips are carried out by plasma enhanced chemical or physical vapor deposition techniques.

The ability to fabricate a low k material by a plasma enhanced chemical vapor deposition (PECVD) technique using previously installed and available processing equipment will thus simplify its integration in the manufacturing process, reduce manufacturing cost, and create less hazardous waste. U.S. Pat. Nos. 6,147,009 and 6,497,963 describe a low dielectric constant material consisting of atoms of Si, C, O and H having a dielectric constant not more than 3.6 and which exhibits very low crack propagation velocities.

U.S. Pat. Nos. 6,312,793, 6,441,491, 6,541,398 and 6,479,110 B2 describe a multiphase low k dielectric material that consists of a matrix phase composed of atoms of Si, C, O and H and another phase composed mainly of C and H. The dielectric materials disclosed in the foregoing patents have a dielectric constant of not more than 3.2.

U.S. Pat. No. 6,437,443 describes a low k dielectric material that has two or more phases wherein the first phase is formed of a SiCOH material. The low k dielectric material is provided by reacting a first precursor gas containing atoms of Si, C, O, and H and at least a second precursor gas containing mainly atoms of C, H, and optionally F, N and O in a plasma enhanced chemical vapor deposition chamber.

Despite the numerous disclosures of methods of fabricating low k SiCOH dielectric films, the prior art SiCOH films contain a high content of C atoms (typically about 10–20 atomic % or greater) that increase the leakage currents of the device containing the SiCOH film. The increase in leakage current, in turn, degrades the insulating property of the film and therefore adversely effects the films reliability. Thus, there is a need for providing SiCOH films that have improved leakage current using a method that does not effect the dielectric constant and/or the reliability of the SiCOH film.

SUMMARY OF THE INVENTION

The present invention provides a method of fabricating a SiCOH dielectric film that has improved insulating properties as compared with prior art dielectric films, including prior art SiCOH dielectric films that are not subjected to the inventive deep ultra-violet (DUV) laser anneal. The improved properties include reduced current leakage which is achieved without adversely effecting (increasing) the dielectric constant of the SiCOH dielectric film. In accordance with the present invention, a SiCOH dielectric film exhibiting reduced current leakage and improved reliability is obtained by subjecting an as deposited SiCOH dielectric film to a DUV laser anneal step. It is the applicants' belief that the DUV laser anneal step of the present invention likely removes the weakly bonded C from the film, thus improving leakage current.

Electron beam is currently used to stabilize many dielectric films including SiCOH dielectric films. The drawback of using electron beam treatment is that weakly bonded C is not typically removed from the film and the introduced electrons may cause unwanted changes to the film. High temperature annealing (on the order of about 500° C. to about 600° C.) also does not typically remove C and thus cannot stabilize the film. A photoreaction between C atoms and deep UV is needed to improve the quality of the SiCOH dielectric film.

In broad terms, the method of the present invention comprises the steps of:

providing a dielectric film comprising atoms of Si, C, O and H on a surface of a substrate; and irradiating said dielectric film using a deep ultra-violet (DUV) laser to cause a photochemical reaction within the dielectric film which improves the insulating properties of the film as compared with a non-DUV laser treated SiCOH film.

In addition to the method described above, the present invention also provides a SiCOH dielectric film which has improved insulating properties, i.e., reduced leakage current, as compared with a non-DUV treated SiCOH film.

In broad terms, the inventive dielectric film of the present invention comprises a dielectric material comprising atoms of Si, C, O and H, said dielectric material having a covalently bonded tri-dimensional network structure, a dielectric constant of not more than 2.8 and a reflectance spectra that is substantially equivalent to $SiO_2$.

By "substantially equivalent to $SiO_2$" it is meant that the SiCOH dielectric film has about 60% reflectance at DUV (248 nm) typical of $SiO_2$ as shown in FIG. 6, where the $SiO_2$ and laser annealed SiCOH films have about the same reflectance spectra. For an unexposed SiCOH film, the reflectance at DUV is low (approximately 20%) indicating absorption due to C atoms.

As stated above, the inventive DUV treated SiCOH dielectric film has improved insulating properties as compared to a non-DUV treated SiCOH dielectric film. The improved insulating properties include reduced leakage current that is observed when the inventive films are used in electronic structures. In particular, the inventive DUV laser treated SiCOH dielectric film has a current density at least one to several orders of magnitude less leakage current as compared to a non-DUV laser (i.e., as deposited) SiCOH dielectric. This is shown in FIG. 8 where a C rich SiCOH film has very high leakage currents as deposited (off-scale in FIG. 8) and after laser anneal leakage currents are greatly reduced at about $10^{-7}$ $A/cm^2$ at −2V. The reflectance spectra for this particular sample is shown in FIG. 7. Before laser annealing, the SiCOH film has a low reflectance (approximately 15%) at DUV (curve C), and, after laser annealing, the reflectance is about 60% at DUV, which is typical of $SiO_2$ films (curve D).

The present invention also relates to electronic structures that include at least one insulating material that comprises the inventive DUV laser treated SiCOH dielectric film of the present invention. The at least one dielectric film comprising the inventive DUV laser treated SiCOH dielectric may comprise an interlevel and/or intralevel dielectric layer, a capping layer, and/or a hard mask/polish-stop layer in an electronic structure.

DETAILED DESCRIPTION OF THE INVENTION

Figure 1A:
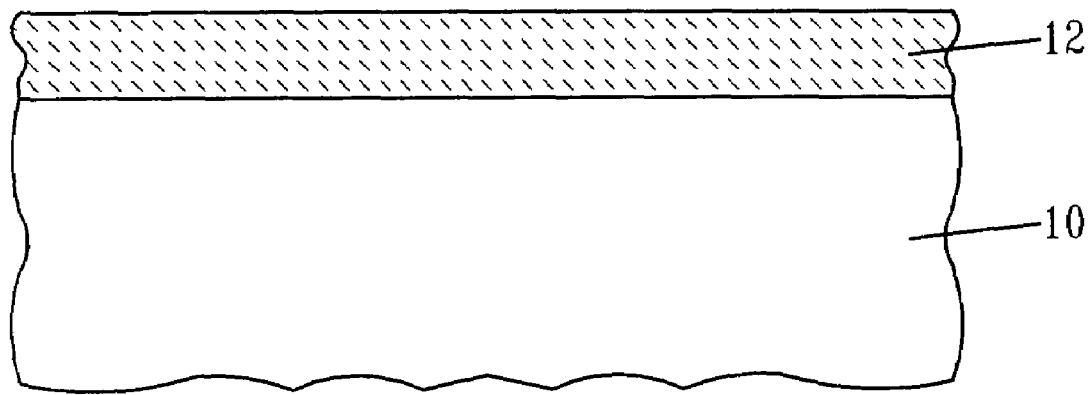
FIGS. 1A–1B are pictorial representations (through cross sectional views) illustrating the basic processing steps of the present invention.

The present invention, which describes a method of fabricating a SiCOH dielectric material having improved insulating properties, a DUV laser treated SiCOH dielectric film and electronic structures containing the same, will now be described in greater detail. In accordance with the method of the present invention, a SiCOH dielectric film 12 is formed on a surface of a substrate 10 such as shown, for example, in FIG. 1A. The term "substrate" when used in conjunction with substrate 10 includes, a semiconducting material, an insulating material, a conductive material or any combination thereof, including multilayered structures. Thus, for example, substrate 10 can be a semiconducting material such as Si, SiGe, SiGeC, SiC, GaAs, InAs, InP and other III/V or II/VI compound semiconductors. The semiconductor substrate 10 can also include a layered substrate such as, for example, Si/SiGe, Si/SiC, silicon-on-insulators (SOIs) or silicon germanium-on-insulators (SGOIs). When substrate 10 is an insulating material, the insulating material can be an organic insulator, an inorganic insulator or a combination thereof including multilayers. When the substrate 10 is a conductive material, the substrate 10 may include, for example, polySi, an elemental metal, alloys of elemental metals, a metal silicide, a metal nitride and combinations thereof, including multilayers.

In some embodiments, the substrate 10 includes a combination of a semiconducting material and an insulating material, a combination of a semiconducting material and a conductive material or a combination of a semiconducting material, an insulating material and a conductive material. An example of a substrate that includes a combination of the above is an interconnect structure.

The SiCOH dielectric film 12 is typically deposited using plasma enhanced chemical vapor deposition (PECVD). In addition to PECVD, the present invention also contemplates that the SiCOH dielectric film 12 can be formed utilizing chemical vapor deposition (CVD), high-density plasma (HDP) deposition, pulsed PECVD, spin-on application, or other related methods. The thickness of the dielectric film 12 deposited may vary; typical ranges for the deposited dielectric film 12 are from about 50 nm to about 1 μm, with a thickness from 100 to about 500 nm being more typical.

Typically, the SiCOH dielectric film is deposited using the processing techniques disclosed in co-assigned U.S. Pat. Nos. 6,147,009, 6,312,793, 6,441,491, 6,437,443, 6,441,491, 6,541,398, 6,479,110 B2, and 6,497,963, the contents of which are incorporated herein by reference.

Specifically, the SiCOH dielectric film 12 is formed by providing at least a first precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming a SiCOH dielectric material. The present invention yet further provides for mixing the first precursor with an oxidizing agent such as $O_2$, $CO_2$ or a combination thereof, thereby stabilizing the reactants in the reactor and improving the uniformity of the dielectric film 12 deposited on the substrate 10.

In addition to the first precursor, a second precursor (gas, liquid or vapor) comprising atoms of C, H, and optionally O, F and N can be used. Optionally, a third precursor (gas, liquid or gas) comprising Ge may also be used.

Preferably, the first precursor is selected from organic molecules with ring structures comprising SiCOH components such as 1,3,5,7-tetramethylcyclotetrasiloxane ("TM-CTS" or "$C_4H_{16}O_4Si_4$"), octamethylcyclotetrasiloxane (OMCTS), diethoxymethylsilane (DEMS), dimethyldimethoxysilane (DMDMOS), diethylmethoxysilane (DEDMOS), and related cyclic and non-cyclic silanes, siloxanes and the like.

The second precursor that may be used is a hydrocarbon molecule. Although any hydrocarbon molecule such as, for example, ethylene, may be used, preferably the second precursor is selected from the group consisting of hydrocarbon molecules with ring structures, preferably with more than one ring present in the molecule or with branched chains attached to the ring. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$"). Also useful are molecules containing branched tertiary butyl (t-butyl) and isopropyl (i-propyl) groups attached to a hydrocarbon ring; the ring may be saturated or unsaturated (containing C=C double bonds). The third precursor may be formed from germane hydride or any other reactant comprising a source of Ge.

The SiCOH film 12 may deposited using a method the includes the step of providing a parallel plate reactor, which has a conductive area of a substrate chuck between about 85 $cm^2$ and about 750 $cm^2$, and a gap between the substrate and a top electrode between about 1 cm and about 12 cm. A high frequency RF power is applied to one of the electrodes at a frequency between about 0.45 Mhz and about 200 Mhz. Optionally, an additional low frequency power can be applied to one of the electrodes.

The conditions used for the deposition step may vary depending on the desired final dielectric constant of the SiCOH dielectric film 12. Broadly, the conditions used for providing a stable dielectric material comprising elements of Si, C, O, H that has a dielectric constant of about 2.8 or less include: setting the substrate temperature at between about 300° C. and about 425° C.; setting the high frequency RF power density at between about 0.1 $W/cm^2$ and about 1.5 $W/cm^2$; setting the first liquid precursor flow rate at between about 100 mg/min and about 5000 mg/min, optionally setting the second liquid precursor flow rate at between about 50 mg/min to about 10,000 mg/min; optionally setting the third liquid precursor flow rate at between about 25 mg/min to about 4000 mg/min; optionally setting the inert carrier gases such as helium (or/and Argon) flow rate at between about 50 sccm to about 5000 sccm; setting the reactor pressure at a pressure between about 1000 mTorr and about 7000 mTorr; and setting the high frequency RF power between about 75 W and about 1000 W. Optionally, an ultra low frequency power may be added to the plasma between about 30 W and about 400 W. When the conductive area of the substrate chuck is changed by a factor of X, the RF power applied to the substrate chuck is also changed by a factor of X.

When an oxidizing agent is employed in the present invention, it is flown into the PECVD reactor at a flow rate between about 10 sccm to about 1000 sccm.

While liquid precursors are used in the above example, it is known in the art that the organosilicon gas phase precursors (such as trimethylsilane) can also be used for the deposition. A porogen can be included during the deposition of the dielectric film 12 that causes subsequent pore formation within the film 12 during a subsequent curing step. The subsequent curing step may occur prior to the DUV laser anneal step or curing may occur during the DUV laser anneal step.

The dielectric film 12 formed at this point of the present invention contains a matrix of a hydrogenated oxidized silicon carbon material (SiCOH) comprising atoms of Si, C, O and H in a covalently bonded tri-dimensional network and having a dielectric constant of not more than about 2.8. The tri-bonded network may include a covalently bonded tri-dimensional ring structure comprising Si—O, Si—C, Si—H, C—H and C—C bonds. The dielectric film 12 may comprise F and N and may optionally have the Si atoms partially substituted by Ge atoms. The dielectric film 12 may contain molecular scale voids (i.e., nanometer-sized pores) of between about 0.3 to about 50 nanometers in diameter, and most preferably between about 0.4 and about 10 nanometers in diameter, further reducing the dielectric constant of the film 12 to values below about 2.0. The nanometer-sized pores of film 12 occupy a volume of between about 0.5% and about 50% of a volume of the material. More preferably, the dielectric constant of the film 12 is from about 1.6 to about 2.6, and most preferably from about 1.8 to about 2.2. The untreated SiCOH film 12 preferably has a thickness of not more than 1.3 micrometers and a crack propagation velocity in water of less than $10^{-9}$ meters per second.

The SiCOH dielectric film 12 comprises between about 5 and about 40 atomic percent of Si; between about 5 and about 45 atomic percent of C; between 0 and about 50 atomic percent of O; and between about 10 and about 55 atomic percent of H. The SiCOH dielectric film 12 is thermally stable above 350° C.

Figure 1B:
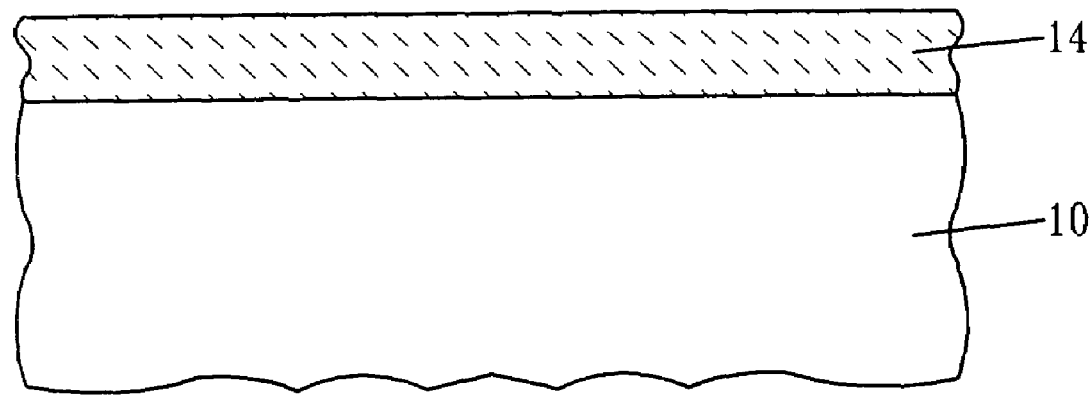

Following the deposition of the SiCOH dielectric film 12 onto the surface of the substrate 10, the resultant structure is irradiating using a deep ultra-violet (DUV) laser source so as to provide a structure, such as shown in FIG. 1B, that includes a DUV treated SiCOH dielectric 14 atop the substrate 10. The laser apparatus employed in the present invention includes any apparatus that includes a laser that is capable of lasing DUV radiation. The term "DUV radiation" denotes radiation that has a wavelength below 350 nm. Examples of such laser apparatuses that can be employed in the present invention include the laser systems depicted in FIGS. 1 and 2 of co-assigned U.S. Pat. No. 6,395,650, the entire content of the '650 patent, particularly the description of the laser systems, is incorporated herein by reference.

The laser source used to treat the deposited SiCOH dielectric film 12 is an excimer laser which operates at one of several DUV wavelengths depending on the laser gas mixture. For example, a XeF laser which produces 308 nm radiation can be employed. Also, a KrF laser that produces 248 nm radiation, or a ArF laser that produces 193 nm radiation can be employed in the present invention. Excimer lasers can operate at several hundred pulses per second with pulse energies up to a Joule (J) resulting in several hundred Watt (W) output.

The laser employed in treating the deposited SiCOH dielectric film 12 preferably operates under a pulse mode. The laser beam can be expanded to expose the entire sample. Alternatively, and for larger samples, the laser exposure area can be raster scanned across the sample to provide uniform dose. Using excimer laser, the fluence is limited to less than 5 $mJ/cm^2$ per pulse to ensure ablation will not occur. The short pulse duration of about 10 ns for the excimer laser can cause material ablation at fluence levels greater than 20 $mJ/cm^2$. Typically, laser fluence levels of 0.1–5 $mJ/cm^2$ per pulse are employed. The total dose can vary from 1 to 10000

Joules/cm$^2$, preferably 500–2000 J/cm$^2$. This is achieved by multiple laser pulse exposure. For example, a dose of 1000 J/cm$^2$ can be obtained using a fluence of 1 mJ/cm$^2$ for a duration of 10$^6$ pulses. Excimer laser normally operates at a few hundreds pulses per second. Depending of the total dosage required, the overall exposure time period for the DUV laser treatment for a several seconds to hours. A typical 500 J/cm$^2$ dose is achieved in less than 15 min using a 200 Hz laser operating at a fluence level of 3 mJ/cm$^2$ per pulse.

The DUV laser annealed SiCOH film 14 of the present invention is more stable than a non-DUV treated SiCOH film (such as film 12). The DUV treated SiCOH film 14 of the present invention has a dielectric constant that is substantially the same as the dielectric constant of the as deposited SiCOH dielectric film 12. A slight increase or decrease (±0.5) in the dielectric constant from the original value of the as deposited SiCOH film 12 may be seen with the DUV treated films. Thus, the DUV treated SiCOH film 14 has a dielectric constant of less than 2.8 (±0.5). The DUV treated SiCOH dielectric film 14 also has other characteristics, e.g., a tri-bonded network, porosity, crack velocity, thermal stability above 350° C., etc, that are also similar to the as deposited SiCOH dielectric film 12.

One difference between the DUV treated SiCOH film 14 and the as deposited film 12 is that a photochemical reaction occurs within the film which is believed to remove weakly bonded C from the treated film 14. The C content within the DUV laser annealed film 14 is thus slightly less than the untreated dielectric film 12. A decrease in C content occurs in the inventive DUV treated SiCOH dielectric film 14. The reduction of C content within the DUV treated film 14 provides a dielectric film that has a reflectance spectra that is substantially the same as that of SiO$_2$ which is indicative that C has been removed from the film during the DUV laser treatment. This is clearly shown in FIGS. 6 and 7 where reflectance spectra are about 15–20% at DUV for as deposited films. These low reflectance values are due to C absorption. After laser treatment, SiCOH reflectance spectra are about the same as SiO$_2$ at DUV indicating that C has been, at least, partly removed.

In some embodiments, the DUV treated dielectric film 14 has a leakage current reduction that is about 10 or more after laser treatment. The inventive dielectric film 14 also can have a reflectance spectra that is characterized as having about 60–70% reflectance at 248 nm.

The SiCOH dielectric film 14 of the present invention may be used as the interlevel and/or intralevel dielectric, a capping layer, and/or as a hard mask/polish-stop layer in electronic structures.

The electronic structure of the present invention includes a pre-processed semiconducting substrate that has a first region of metal embedded in a first layer of insulating material, a first region of conductor embedded in a second layer of insulating material, the second layer of insulating material being in intimate contact with the first layer of insulating material, the first region of conductor being in electrical communication with the first region of metal, and a second region of conductor being in electrical communication with the first region of conductor and being embedded in a third layer of insulating material, the third layer of insulating material being in intimate contact with the second layer of insulating material.

In the above structure, each of the insulating layers can comprise the inventive SiCOH dielectric film 14 that has been treated by DUV laser exposure.

The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

The dielectric cap material can be selected from silicon oxide, silicon nitride, silicon oxynitride, silicon carbon nitride (SiCN), refractory metal silicon nitride with the refractory metal being Ta, Zr, Hf or W, silicon carbide, silicon carbo-oxide, carbon doped oxides and their hydrogenated or nitrided compounds. In some embodiments, the dielectric cap itself can comprise the inventive DUV treated SiCOH dielectric material. The first and the second dielectric cap layers may be selected from the same group of dielectric materials. The first layer of insulating material may be silicon oxide or silicon nitride or doped varieties of these materials, such as PSG or BPSG.

The electronic structure may further include a diffusion barrier layer of a dielectric material deposited on at least one of the second and third layer of insulating material. The electronic structure may further include a dielectric layer on top of the second layer of insulating material for use as a RIE hard mask/polish-stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE diffusion barrier layer on top of the first dielectric polish-stop layer a second dielectric RIE hard mask/polish-stop layer on top of the third layer of insulating material, and a second dielectric diffusion barrier layer on top of the second dielectric polish-stop layer. The dielectric RIE hard mask/polish-stop layer may be comprised of the inventive SiCOH dielectric material as well.

The electronic devices which can contain the inventive DUV laser treated SiCOH dielectric film are shown in FIGS. 2–5. It should be noted that the devices shown in FIGS. 2–5 are merely illustrative examples of the present invention, while an infinite number of other devices may also be formed by the present invention novel methods.

Figure 2:
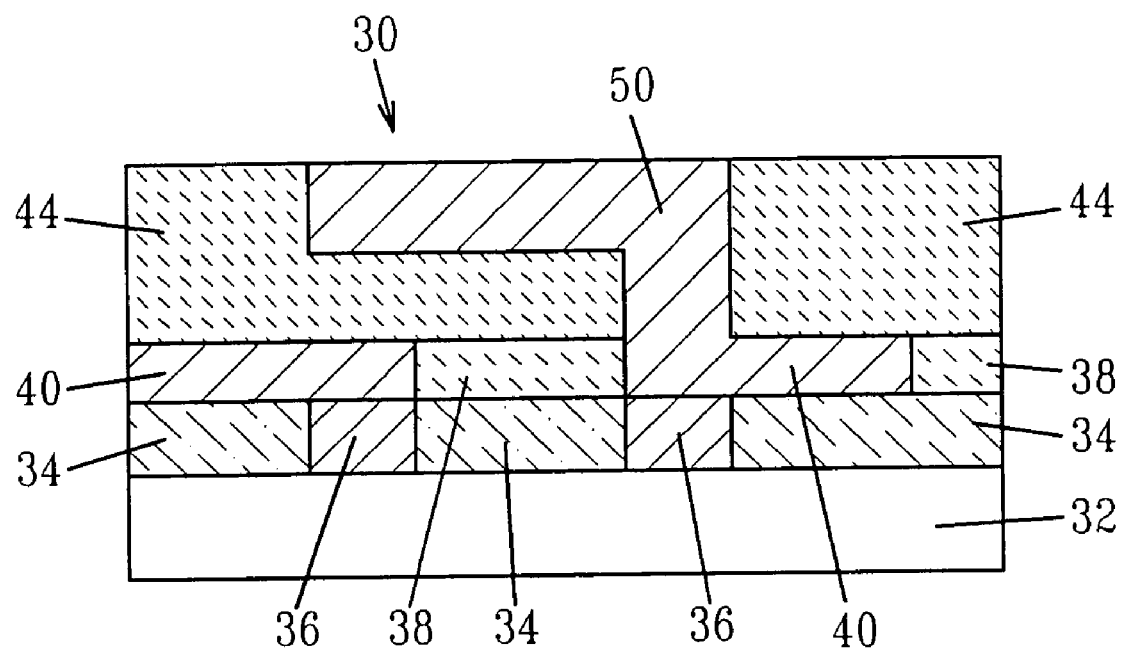
FIG. 2 is an enlarged, cross-sectional view of an electronic device of the present invention that includes the inventive DUV laser treated SiCOH dielectric film as both the intralevel dielectric layer and the interlevel dielectric layer.

In FIG. 2, an electronic device 30 built on a semiconductor substrate 32 is shown. On top of the semiconductor substrate 32, an insulating material layer 34 is first formed with a first region of metal 36 embedded therein. After a CMP process is conducted on the first region of metal 36, a DUV laser treated SiCOH dielectric film 38 of the present invention is formed on top of the first layer of insulating material 34 and the first region of metal 36. The first layer of insulating material 34 may be suitably formed of silicon oxide, silicon nitride, doped varieties of these materials, or any other suitable insulating materials. The DUV laser treated SiCOH dielectric film 38 is then patterned in a photolithography process followed by etching and a conductor layer 40 is deposited thereon. After a CMP process on the first conductor layer 40 is carried out, a second layer of the inventive DUV laser treated SiCOH film 44 is deposited by a plasma enhanced chemical vapor deposition process overlying the first DUV laser treated SiCOH dielectric film 38 and the first conductor layer 40. The conductor layer 40 may be a deposit of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on the DUV laser treated SiCOH dielectric film 44, followed by etching and then a deposition process for the second conductor material. The second region of conductor 50 may also be a deposit of either a metallic material or a nonmetallic material, similar to that used in depositing the first conductor layer 40. The second region of conductor 50 is in electrical communication with the first region of conductor 40 and is embedded in the second layer of the DUV laser treated SiCOH dielectric film 44. The second layer of the DUV laser treated SiCOH dielectric film 44 is in intimate contact with the first layer of the DUV laser treated SiCOH dielectric material 38. In this example, the first layer of the DUV laser treated SiCOH dielectric film 38 is an intralevel dielectric material, while the second layer of the DUV laser treated SiCOH dielectric film 44 is both an intralevel and an interlevel dielectric. Based on properties of the inventive DUV laser treated SiCOH dielectric films, superior insulating property can be achieved by the first insulating layer 38 and the second insulating layer 44.

Figure 3:
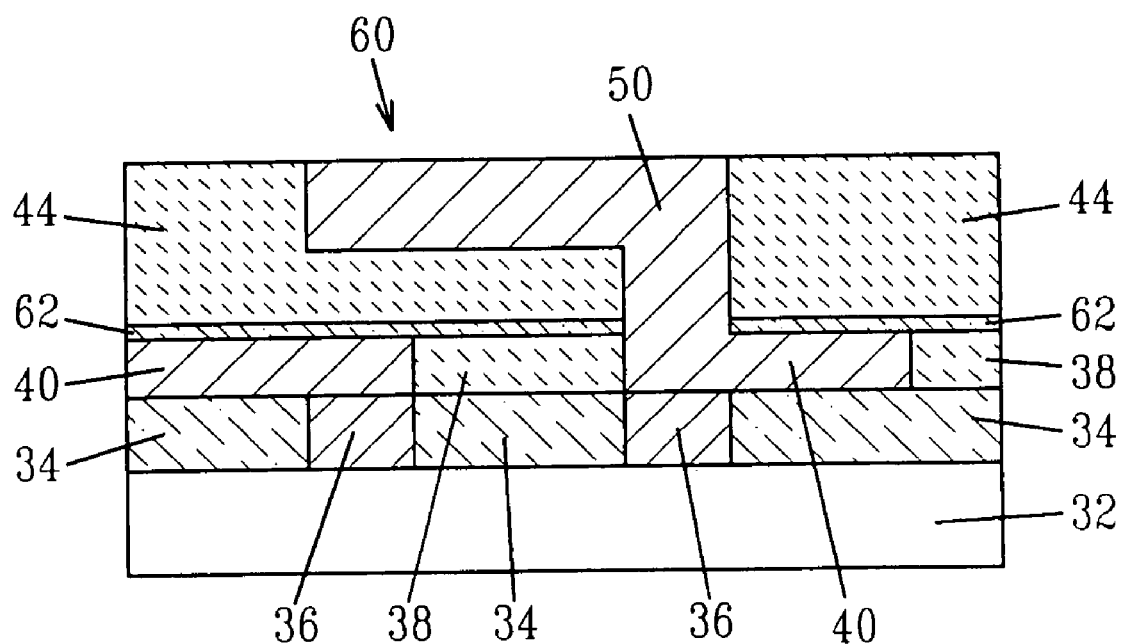
FIG. 3 is an enlarged, cross-sectional view of the electronic structure of FIG. 2 having an additional diffusion barrier dielectric cap layer deposited on top of the inventive DUV laser treated SiCOH dielectric film.

FIG. 3 shows a present invention electronic device 60 similar to that of electronic device 30 shown in FIG. 2, but with an additional dielectric cap layer 62 deposited between the first insulating material layer 38 and the second insulating material layer 44. The dielectric cap layer 62 can be suitably formed of a material such as silicon oxide, silicon nitride, silicon oxynitride, refractory metal silicon nitride with the refractory metal being Ta, Zr, Hf or W, silicon carbide, silicon carbo-nitride (SiCN), silicon carbo-oxide (SiCO), and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 4:
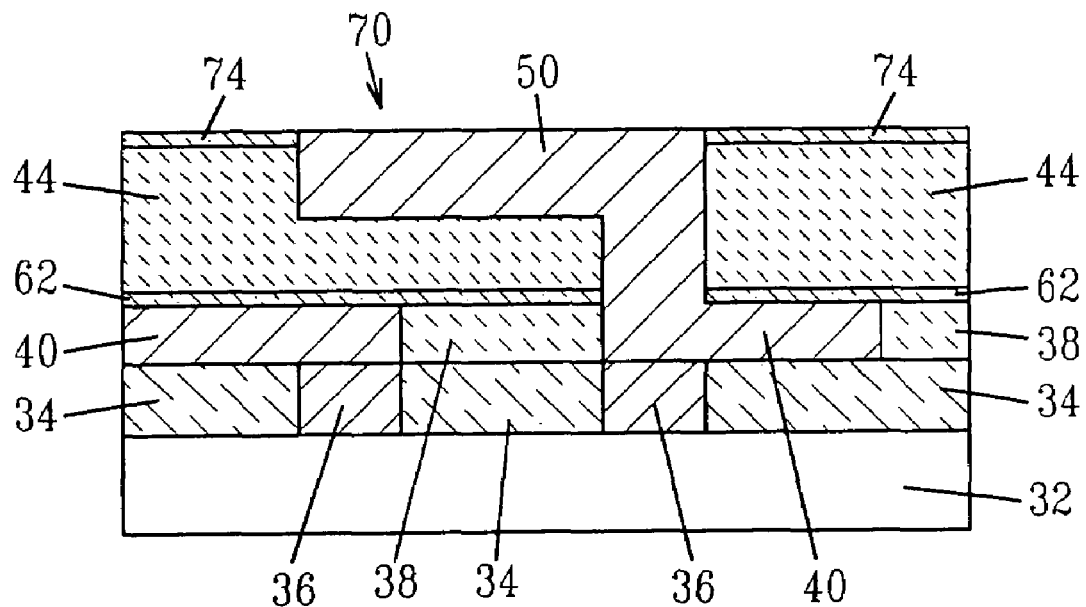
FIG. 4 is an enlarged, cross-sectional view of the electronic structure of FIG. 3 having an additional RIE hard mask/polish-stop dielectric cap layer and a dielectric cap diffusion barrier layer deposited on top of the polish-stop layer.

Another alternate embodiment of the present invention electronic device 70 is shown in FIG. 4. In the electronic device 70, two additional dielectric cap layers 72 and 74 which act as a RIE mask and CMP (chemical mechanical polishing) polish stop layer are used. The first dielectric cap layer 72 is deposited on top of the first DUV laser treated SiCOH dielectric material 38 and used as a RIE mask and CMP stop, so the first conductor layer 40 and layer 72 are approximately co-planar after CMP. The function of the second dielectric layer 74 is similar to layer 72, however layer 74 is utilized in planarizing the second conductor layer 50. The polish stop layer 74 can be a deposit of a suitable dielectric material such as silicon oxide, silicon nitride, silicon oxynitride, refractory metal silicon nitride with the refractory metal being Ta, Zr, Hf or W, silicon carbide, silicon carbo-oxide (SiCO), and their hydrogenated compounds. A preferred polish stop layer composition is SiCH or SiCOH for layers 72 or 74. When layer 72 is comprised of SiCOH, it is preferred that the inventive DUV laser treated SiCOH film be employed. A second dielectric layer 74 can be added on top of the second DUV laser treated SiCOH dielectric film 44 for the same purposes.

Figure 5:
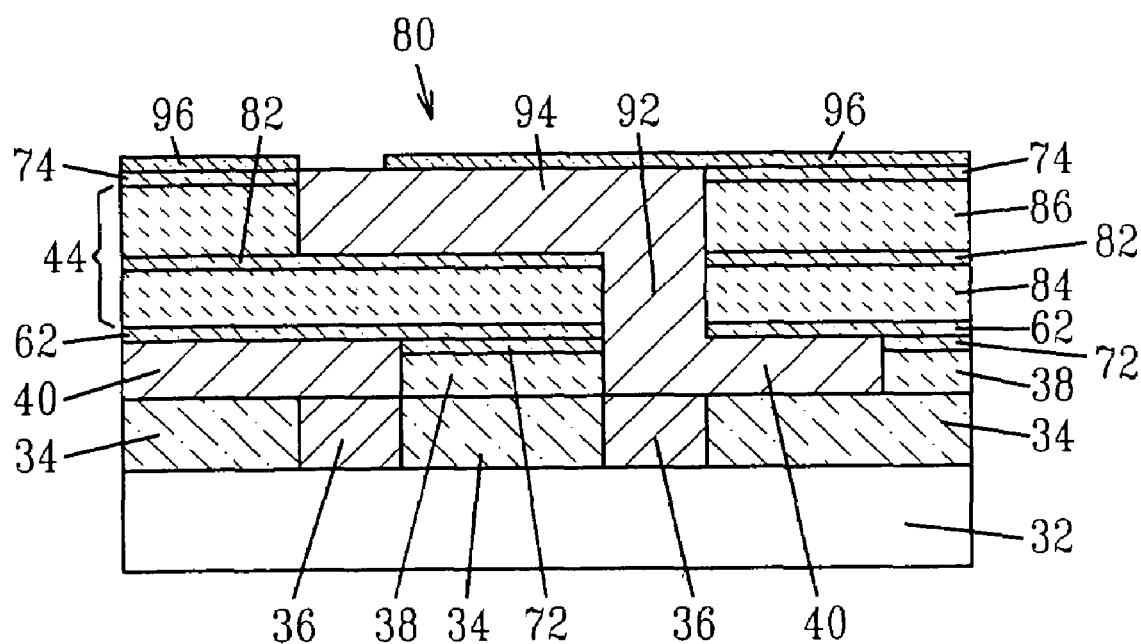
FIG. 5 is an enlarged, cross-sectional view of the electronic structure of FIG. 4 having additional RIE hard mask/polish-stop dielectric layers deposited on top of the DUV laser treated SiCOH dielectric film of the present invention.

Still another alternate embodiment of the present invention electronic device 80 is shown in FIG. 5. In this alternate embodiment, an additional layer 82 of dielectric material is deposited and thus dividing the second insulating material layer 44 into two separate layers 84 and 86. The intralevel and interlevel dielectric layer 44 formed of the inventive DUV laser treated SiCOH dielectric film, shown in FIG. 2, is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefit provided by this alternate embodiment electronic structure 80 is that dielectric layer 82 acts as an RIE etch stop providing superior interconnect depth control. Thus, the composition of layer 82 is selected to provide etch selectivity with respect to layer 86.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material and a second dielectric cap layer on top of the third layer of insulating material, wherein the first and the second dielectric cap layers are formed of a material that includes the inventive DUV laser treated SiCOH dielectric film.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer comprise the DUV laser treated SiCOH film of the present invention formed on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer comprise the DUV laser treated SiCOH dielectric film of the present invention.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers comprise laser treated SiCOH dielectric film of the present invention.

Still other alternate embodiments of the present invention includes an electronic structure that has layers of insulating material as intralevel or interlevel dielectrics in a wiring structure similar to that described immediately above but further includes a dielectric cap layer which comprises the DUV laser treated SiCOH dielectric material of the present invention situated between an interlevel dielectric layer and an intralevel dielectric layer.

The following example is provided to illustrate the method of the present invention and to demonstrate some advantages of the resultant DUV laser treated SiCOH dielectric film.

EXAMPLE

Figure 6:
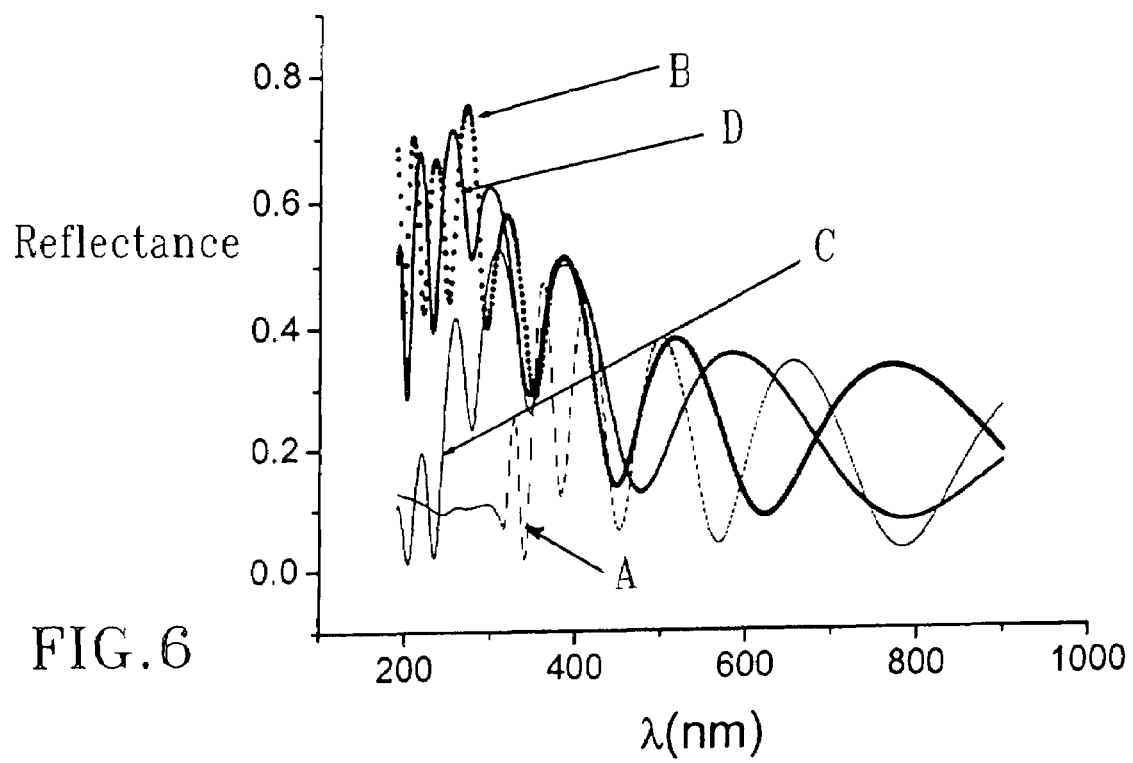
FIG. 6 is a plot of reflectance vs. wavelength for various dielectric films including $SiO_2$, SiLK® (a polyarylene ether supplied by The Dow Chemical Co.), SiCOH without laser treatment, and a DUV laser treated SiCOH film.

In this example, various dielectric films were deposited on a substrate and the reflectance spectra of each of the dielectric films were obtained by using an n&k analyzer by n&k Technology (Santa Clara, Calif.). The resultant reflectance spectra (reflectance vs. wavelength in nm) are shown in FIG. 6. The samples including a SiLK® film (Curve A, segmented line), an as deposited SiCOH dielectric (Curve C, solid line) and a DUV treated SiCOH dielectric film (Curve D, solid and bolded line) are compared with an $SiO_2$ simulated spectra (Curve B, dotted line).

The sample including the SiLK® film was prepared by spin-on coating a 500 nm layer of SiLK® onto a Si substrate. The $SiO_2$ sample was simulated using the internal film library supplied with the n&k tool manufacturer. The untreated SiCOH containing sample of FIG. 6 was prepared by PECVD of TMCTS. The resultant non-DUV laser treated SiCOH film had an as deposited thickness of about 400 nm. The same film was subjected to laser treatment using a 248 nm laser source. The conditions for the laser anneal were as follows: 30 J/min for a total dose of 1800 J.

The reflectance spectrum shown in FIG. 6 illustrated that the SiLK® (curve A) film which had a high C content exhibited low reflectance of about 10% at DUV compared with approximately 30% for an untreated SiCOH film (Curve C, solid line). As stated before, the higher the C content in the films, the higher is the absorption (low reflectance). After laser treatment the SiCOH film (Curve D, solid and bolded line) exhibited a reflectance spectra similar to $SiO_2$ (about 60% reflectance at DUV, Curve B, dotted line) indicating that the C content had been greatly reduced.

Figure 7:
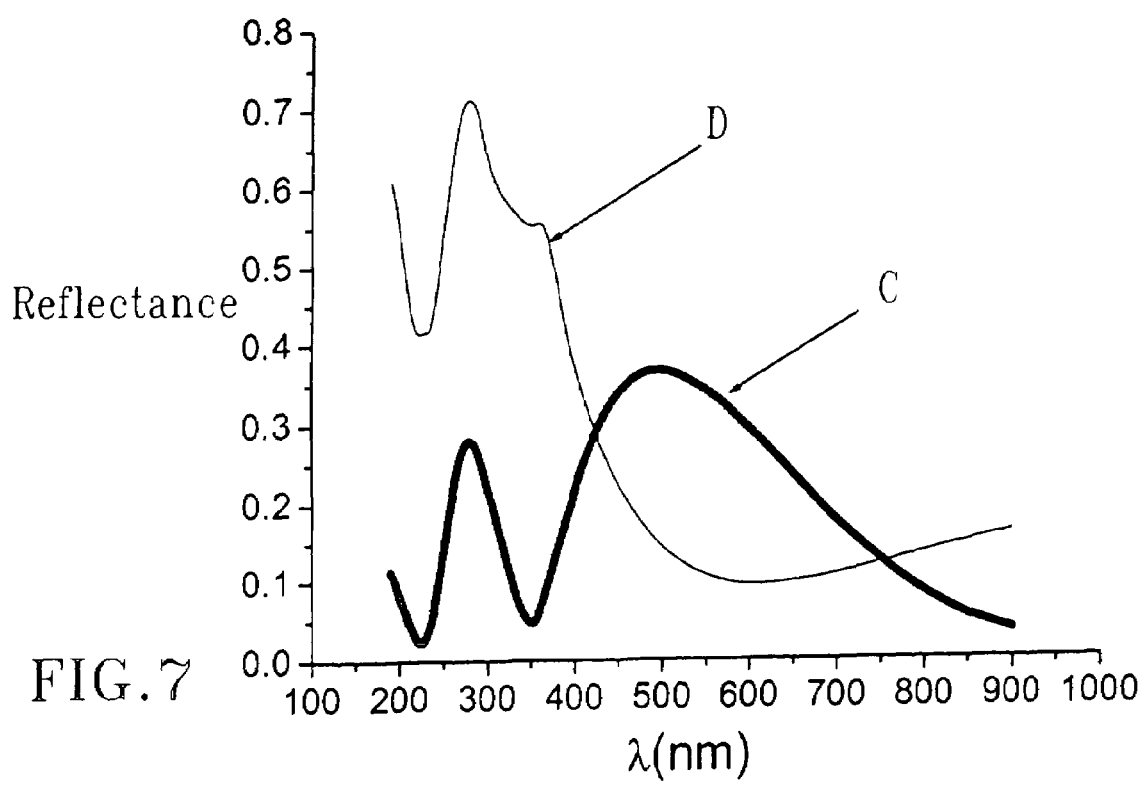
FIG. 7 is a plot of reflectance vs. wavelength for a non-DUV laser treated SiCOH dielectric film and a DUV laser treated SiCOH dielectric film.
Figure 8:
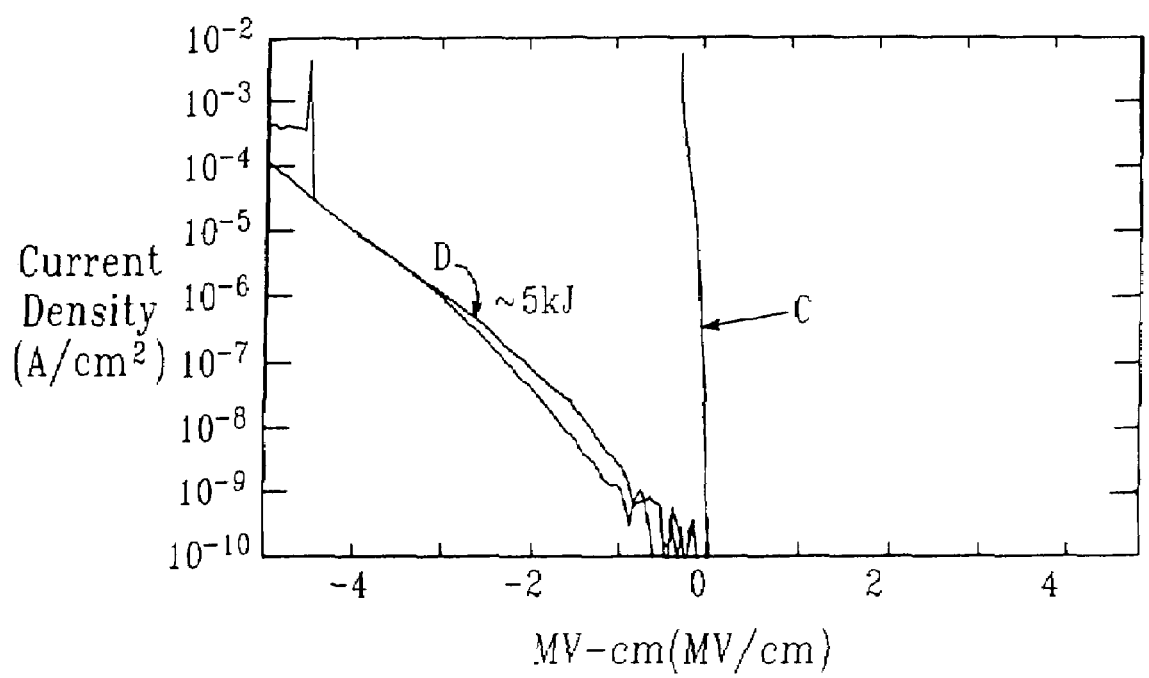
FIG. 8 is a graph showing the current-voltage characteristics of a SiCOH film before and after DUV laser treatment.

FIG. 7 shows a simplified spectrum containing only the non-DUV treated SiCOH dielectric film (Curve C) and the DUV laser treated SiCOH film (Curve D). In this case, the film was deposited by PECVD at 20 mTorr using TMCTS (flow rate 100 sccm) and 10% acetylene in He (flow rate 40 sccm) as the precursors. The acetylene was added to increase the carbon content to the SiCOH film. Film thickness was about 150 nm. Again, here, as shown before, the as deposited SiCOH film had a reflectance spectra of about 15% at DUV which is lower than 30% for the SICOH film of FIG. 6. This is due to the increased C content for the film shown in FIG. 7. After approximately 5 kJ laser treatment the reflectance spectra was about 60% at DUV typical of $SiO_2$ showing again C removal (FIG. 7, curve D). The current-voltage characteristics for the same samples of FIG. 7 are shown in FIG. 8. Note that before laser treatment at −2V leakage current is very high and off-scale (curve C). After laser treatment leakage current is about $10^{-7}$ $A/cm^2$ at −2V, decreasing by several orders of magnitudes as compared with the untreated sample. This again shows that C removal is important is achieving low leakage currents.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a dielectric film comprising the steps of:
   providing a dielectric film comprising atoms of Si, C, O and H on a surface of a substrate; and
   irradiating said dielectric film using a deep ultra-violet (DUV) excimer laser to cause a photochemical reaction within the dielectric film which improves insulating properties of the film as compared with a non-DUV laser treated SiCOH film.

2. The method of claim 1 wherein said substrate comprises a semiconducting material, an insulating material, a conductive material or a combination, including multilayers thereof.

3. The method of claim 2 wherein said substrate is a semiconducting material.

4. The method of claim 1 wherein said providing said dielectric film comprises a deposition process selected from the group consisting of plasma-enhanced chemical vapor deposition (PECVD), high-density plasma (HDP) deposition, pulsed PECVD and spin-on coating.

5. The method of claim 4 wherein said deposition process comprises PECVD.

6. The method of claim 1 wherein said providing said dielectric film comprising selecting at least a first precursor comprising atoms of Si C, O and H.

7. The method of claim 6 further comprising selecting a second precursor comprising atoms of C, H and optionally O, F, and N.

8. The method of claim 7 further comprising selecting a third precursor comprising Ge.

9. The method of claim 6 wherein said first precursor is an organic molecule containing a ring structure.

10. The method of claim 9 wherein said first precursor is 1, 3, 5, 7-tetramethylcyclotetrasiloxane (TMCTS), octamethylcyclotetrasiloxane (OMCTS), diethoxymethylsilane (DEMS), dimethyldimethoxysilane (DMDMOS), or diethylmethoxysilane (DEDMOS).

11. The method of claim 7 wherein said second precursor is a hydrocarbon molecule.

12. The method of claim 11 wherein said hydrocarbon molecule is an oxabicyclic compound or ethylene.

13. The method of claim 8 wherein said third precursor is germane hydride.

14. The method of claim 1 wherein said providing said dielectric film comprises selecting 1, 3, 5, 7-tetramethylcyclotetrasiloxane (TMCTS) as a first precursor and ethylene or cyclopentene oxide as a second precursor and depositing said first and second precursors by PECVD.

15. The method of claim 1 wherein said dielectric film prior to said irradiating has a dielectric constant of about 2.8 or less.

16. The method of claim 1 wherein said excimer laser is a ArF laser operating at 193 nm, a KrF laser operating at 248 nm or a XeF laser operating at 308 nm.

17. The method of claim 1 wherein said irradiating is performed using a pulse or raster scan mode.

18. The method of claim 1 wherein said irradiating is performed at a fluence from about 0.1 to about 5 $mJ/cm^2$ pulse.

19. A method of forming a dielectric film comprising the steps of:
   providing a dielectric film comprising atoms of Si, C, O and H on a surface of a substrate; and
   irradiating said dielectric film using a deep ultra-violet (DUV) laser that operates in a pulse or raster scan mode to cause a photochemical reaction within the dielectric film which improves insulating properties of the film as compared with a non-DUV laser treated SiCOH film.

20. A method of forming a dielectric film comprising the steps of:
   providing a dielectric film comprising atoms of Si, C, O and H on a surface of a substrate; and
   irradiating said dielectric film using a deep ultra-violet (DUV) laser to cause a photochemical reaction within the dielectric film which improves insulating properties of the film as compared with a non-DUV laser treated SiCOH film, said dielectric film having an absorption spectra that is substantially equivalent to $SiO_2$.

* * * * *